United States Patent [19]

Klara et al.

[11] Patent Number: 4,608,669
[45] Date of Patent: Aug. 26, 1986

[54] SELF CONTAINED ARRAY TIMING

[75] Inventors: Walter S. Klara, Hopewell Junction; Theodore W. Kwap, Brewster; Victor Marcello, Stormville; Robert A. Rasmussen, LeGrangeville, all of N.Y.

[73] Assignee: International Business Machines Corporation, Armonk, N.Y.

[21] Appl. No.: 611,817

[22] Filed: May 18, 1984

[51] Int. Cl.$^4$ .............................................. G11C 7/00
[52] U.S. Cl. .................................. 365/201; 365/233; 365/194; 371/21
[58] Field of Search ...................... 365/201, 194, 233; 324/158 T, 73 AT; 371/21

[56] References Cited

U.S. PATENT DOCUMENTS

| | | | |
|---|---|---|---|
| 3,311,890 | 3/1967 | Waaben | 340/172.5 |
| 3,420,991 | 1/1969 | Ling | 235/153 |
| 3,439,343 | 4/1969 | Stahle | 340/172.5 |
| 3,474,421 | 10/1969 | Stein | 340/174 |
| 3,633,174 | 1/1972 | Griffin | 340/172.5 |
| 3,751,649 | 8/1973 | Hart, Jr. | 235/153 |
| 3,921,142 | 11/1975 | Bryant et al. | 340/172.5 |
| 3,924,144 | 12/1975 | Hadamard | 307/303 |
| 3,940,601 | 2/1976 | Henry et al. | 235/153 |
| 3,944,800 | 3/1976 | Beck et al. | 235/153 |
| 3,961,251 | 6/1976 | Hurley et al. | 371/21 |
| 3,961,252 | 6/1976 | Eichelberger | 324/73 AT |
| 3,961,254 | 6/1976 | Cavaliere et al. | 371/21 |
| 4,001,818 | 1/1977 | Radichel et al. | 340/415 |
| 4,038,648 | 7/1977 | Chesley | 340/173 |
| 4,049,956 | 9/1977 | Van Veen | 235/153 |
| 4,055,754 | 10/1977 | Chesley | 235/302 |
| 4,066,880 | 1/1978 | Salley | 235/302.3 |
| 4,171,765 | 10/1979 | Lemone | 235/312 |
| 4,195,770 | 4/1980 | Benton et al. | 371/21 |
| 4,227,244 | 10/1980 | Thorsrud et al. | 364/200 |
| 4,263,669 | 4/1981 | Staiger | 371/27 |
| 4,290,137 | 9/1981 | Hilker | 371/24 |
| 4,293,950 | 10/1981 | Shimizu et al. | 371/21 |
| 4,298,980 | 11/1981 | Hajdu et al. | 371/25 |
| 4,404,519 | 9/1983 | Westcott | 324/73 |
| 4,481,627 | 11/1984 | Beauchesne et al. | 371/21 |

FOREIGN PATENT DOCUMENTS

| | | | |
|---|---|---|---|
| 0053665 | 6/1982 | European Pat. Off. | 371/21 |
| 55-38603 | 3/1980 | Japan | 365/233 |

OTHER PUBLICATIONS

Kelley, "Imbedded Memory Test Methods", IBM Tech. Discl. Bulletin, vol. 21, No. 12, May 1979, pp. 4911–4913.

"A Users Handbook of Semiconductor Memories" by E. R. Hnatek, 1977, John Wiley & Sons, Inc., p. 447.

"Electronic Chip-In-Place Test" by P. Goel and M. T. McMahon, AC, IEE Nineteenth Design Automation Conference Proceedings, Jun. 14–16, 1982, IEEE Catalog No. 82CH1759-0 ACM Order No. 477820, pp. 482–488.

"Logic Card Test Apparatus" by P. B. Shattuck, IBM TDB, vol. 13, No. 3, Aug. 1970, p. 605.

"Integrated Circuit Testing" by P. V. Jordan, IBM TDB, vol. 13, No. 5, Oct. 1970, pp. 1093–1094.

"Pattern Generating System" by E. Legnard et al., IBM TDB, vol. 14, No. 2, Jul. 1971, pp. 482–484.

(List continued on next page.)

Primary Examiner—Terrell W. Fears
Assistant Examiner—Guy M. Miller
Attorney, Agent, or Firm—Wesley DeBruin

[57] ABSTRACT

An on-chip apparatus for generation of timing signals for a large scale integrated (LSI) chip or semiconductor memory array is disclosed. This apparatus may be used both during the production testing of the memory and during normal functional operation. In the testing environment it allows use of much less expensive peripheral test equipment, while also providing for much greater accuracy in determination of whether or not the memory array meets its timing specification. Use during normal functional operation (subsequent to use in the test environment) provides for a guarantee of defect free operation.

7 Claims, 9 Drawing Figures

OTHER PUBLICATIONS

"Arrangement for Minimized Functional Test of LSI Logic Chips" by F. Tsui, IBM TDB, vol. 15, No. 9, Feb. 1973, pp. 2870–2872.

"Single Clock Shift Register Latch" by T. W. Williams, IBM TDB, vol. 16, No. 6, Nov. 1973, p. 1961.

"Comparative Circuit Tester" by E. B. Carey et al., IBM TDB, vol. 16, No. 10, Mar. 1974, pp. 3151–3152.

"Troubleshooting Large-Scale Integrated Circuit Units" by L. D. Howe et al., IBM TDB, vol. 17, No. 7, Dec. 1974, pp. 1941–1944.

"Testing LSI Memory Arrays Using On-Chip I/O Shift Register Latches" by P. S. Balasubramanian et al., IBM TDB, vol. 17, No. 7, Dec. 1974, pp. 2019–2020.

"Combined Test Scanning and Serial-Deserialization Shift Register" by B. M. Ross et al., IBM TDB, vol. 19, No. 2, Jul. 1976, pp. 480–481.

"Memory Testing" by J. Bappert et al., IBM TDB, vol. 19, No. 5, Oct. 1976, p. 1621.

"Pattern Generator for a Multipart Number Test System" by J. N. Arnold et al., IBM TDB, vol. 19, No. 9, Feb. 1977, pp. 3487–3488.

"Delay Testing and Diagnosis of LSSD Shift Register Strings" by K. E. Dimitri, IBM TDB, vol. 20, No. 1, Jun. 1977, pp. 307–312.

"Selective Control of Off-Subassembly Drivers to Test Logic Systems" by F. Hsu et al., IBM TDB, vol. 20, No. 11B, Apr. 1978, pp. 4728–4730.

TIMED PULSE GENERATION

TIMING DIAGRAM—WRITE MODE

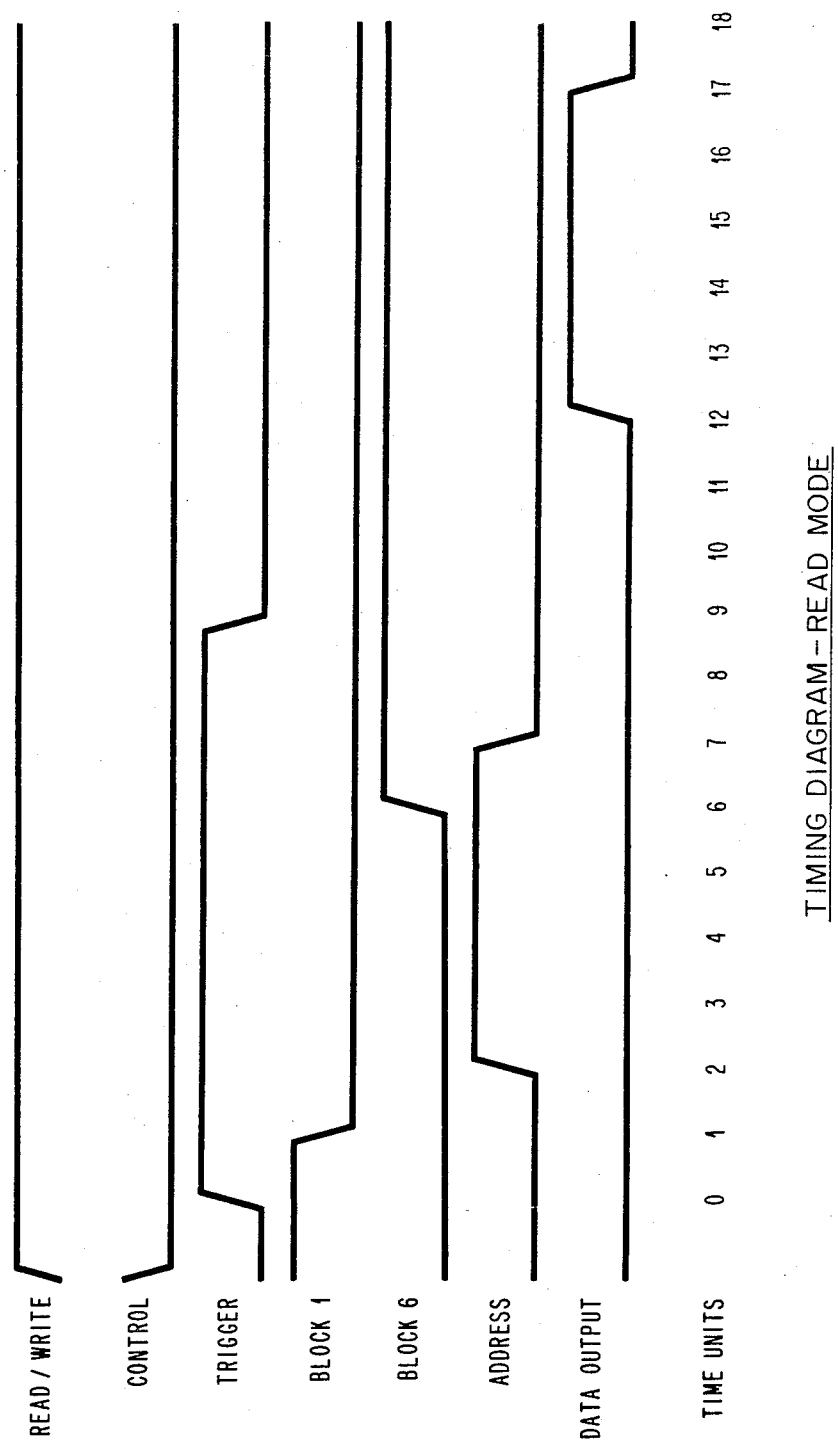

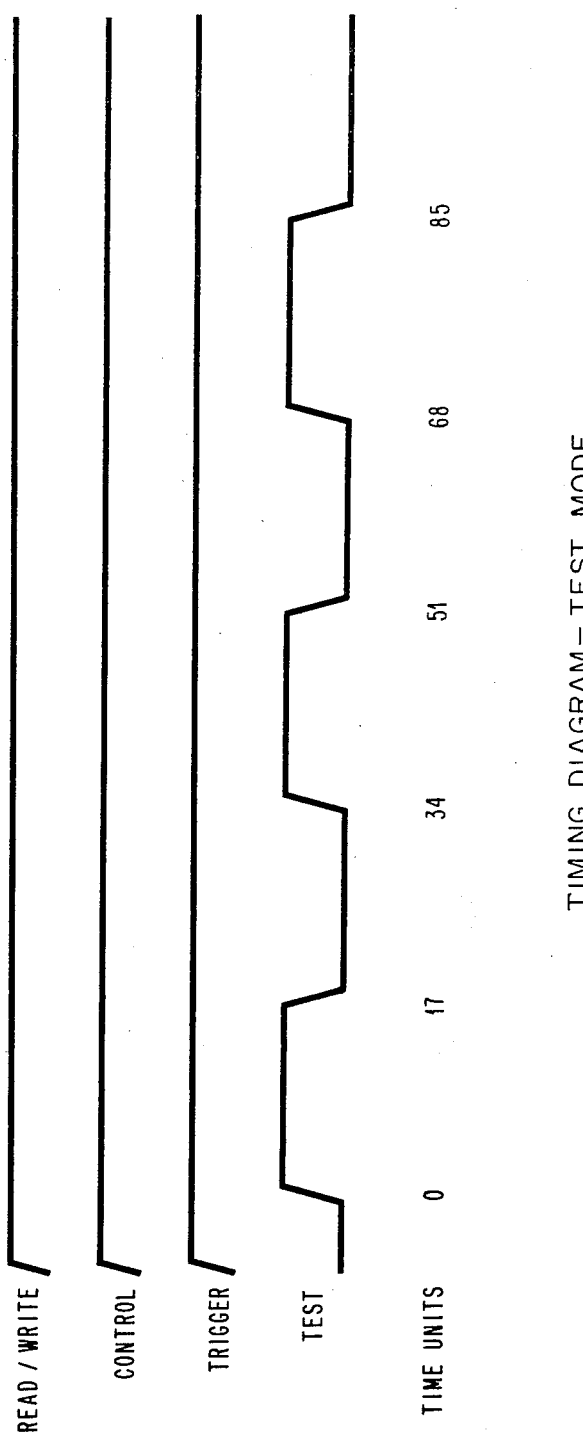
FIG. 7C TIMING DIAGRAM—TEST MODE

SELF CONTAINED ARRAY TIMING

BACKGROUND OF THE INVENTION

FIELD OF THE INVENTION

This invention relates to semiconductor devices and the testing thereof. While not so limited it is primarily concerned with integrated circuit memory devices and methods of testing the same. It is effective whether or not the memory array is embedded in logic.

For purposes of discussion the term "embedded" is defined as that condition of a memory array, circuit element, or even a circuit function on an LSI chip, when surrounded by other circuitry on the chip, such that the memory array, circuit element, or circuit function is not directly accessible, either in whole or in part, from the input and output terminals or pads of the chip.

A prime problem associated with the manufacture of memory arrays is the assurance that the device meets its performance specification. A prime problem in the use of memory arrays is the assurance that the control signals provided to the device fall within this same performance specification. As the performance of these devices is improved it becomes more and more difficult to insure that these problems are resolved in an economical manner.

As the level of integration increases, the circuit designer and component manufacturer are able to offer more and more complex memory arrays to the logic designer and system manufacturer, with higher and higher performance levels. This in turn requires more and more sophisticated circuitry external to the memory device to properly test and utilize it. Without an inexpensive means to guarantee ultimate performance the potential improvements in device design will be lost due to imprecision in the manufacturing test equipment and in the manufacturing tolerances of the supporting circuitry.

CROSS-REFERENCE TO RELATED APPLICATIONS

U.S. patent application Ser. No. 280,050, entitled "Electronic Chip In-Place Test (ECIPT) Structure and Method" filed July 2, 1981 by P. Goel and M. T. McMahon, granted as U.S. Pat. No. 4,441,075 on Apr. 3, 1984.

U.S. patent application Ser. No. 370,214, entitled "Chip Partitioning Aid (CPA)- A Structure For Test Pattern Generation For Large Logic Networks" filed Apr. 20, 1982 by S. Das Gupta, M. C. Graf, R. Rasmussen and T. W. Williams.

U.S. patent application Ser. No. 597,958 entitled "Electronically Selectable Redundant Array" filed Apr. 9, 1984 by M. T. McMahon.

U.S. patent application Ser. No. 625,426 entitled "Memory Cell For Gate Array" filed June 28, 1984 by E. F. Culican et al.

U.S. patent application Ser. No. 624,488 entitled "Bit Selection For 'CTS' RAM" filed by Y. H. Chan et al.

U.S. patent application Ser. No. 624,486 entitled "Voltage Mode Operation Scheme For Bipolar Arrays" filed June 25, 1984 by Y. H. Chan et al.

BACKGROUND OF THE INVENTION AND PRIOR ART

Since memory arrays exist and are in common use it is obvious that the problem of testing them has been widely addressed. It is common in the industry to utilize a special purpose tester that provides logic and timing signals to the device under test with high accuracy. Equipment of this sort is commercially available from a number of vendors. However, improvements in the performance of these memory devices are difficult to match without significant increases in cost for these special purpose testers.

Over the years there has been a lot of work in the field of memory array testing to reduce the cost of this special test equipment. Many efforts have been in the area of generation of the logical signals to be applied to the device under test. Benton (U.S. Pat. No. 4,195,770, issued Apr. 1, 1980) and Shimizu (U.S. Pat. No. 4,293,950, issued Oct. 6, 1981) each describe an apparatus to develop such logic signals. Chesley (U.S. Pat. No. 4,038,648, issued July 26, 1977 and U.S. Pat. No. 4,055,754, issued Oct. 25, 1977) includes an apparatus of this nature in the memory array itself.

Efforts have also involved generation of the timing signals to be applied to the device under test. Staiger (U.S. Pat. No. 4,263,669, issued Apr. 21, 1981 and assigned to the same assignee as the present invention) and Hilker (U.S. Pat. No. 4,290,137, issued Sept. 15, 1981) have each described an apparatus designed to resolve particular problems with generation of specialized timing signals for particular needs of particular memory arrays. The current art is so dependent on this external application of timing signals that Hurley (U.S. Pat. No. 3,961,251, issued June 1, 1976 and assigned to the same assignee as the present invention), Eichelberger (U.S. Pat. No. 3,961,252, issued June 1, 1976 and assigned to the same assignee as the present invention), and Cavaliere (U.S. Pat. No. 3,961,254, issued June 1, 1976 and assigned to the same assignee as the present invention) have described various methods where memory arrays embedded inside a semiconductor device can be accessed by an external tester to provide these timing signals during the testing operation.

Some work has been done to bring the timing generation circuitry onto the same semiconductor device as the memory array, as discussed by Hnatek (A User's Handbook of Semiconductor Memories), John Wiley and Sons, Inc., 1977, pp. 444–450. However, in all previous work including the above the manufacturing test operation has required specialized external test equipment for timing operation.

The following patents and publications are directed to memory testing, timing and on chip test circuitry. It is to be appreciated that the following art is not submitted to necessarily be the only, the best, or the most pertinent art.

Patents

U.S. Pat. No. 3,311,890 entitled "Apparatus for Testing A Storage System" granted Mar. 28, 1967 to S. G. Waaben.

U.S. Pat. No. 3,420,991 entitled "Error Detection System" granted Jan. 7, 1969 to A. T. Ling.

U.S. Pat. No. 3,439,343 entitled "Computer Memory Testing System" granted Apr. 15, 1969 to H. L. Stahle.

U.S. Pat. No. 3,474,421 entitled "Memory Core Testing Apparatus" granted Oct. 21, 1969 to M. O. Stein.

U.S. Pat. No. 3,633,174 entitled "Memory System Having Self-Adjusting Strobe Timing" granted Jan. 4, 1972 to J. H. Griffin.

U.S. Pat. No. 3,751,649 entitled "Memory System Exerciser" granted Aug. 7, 1973 to T. W. Hart.

U.S. Pat. No. 3,921,142 entitled "Electronic Calculator Chip Having Test Input and Output" granted Nov. 18, 1975 to J. D. Bryant et al.

U.S. Pat. No. 3,924,144 entitled "Method For Testing Logic Chips and Logic Chips Adapted Therefor" granted Dec. 2, 1975 to G. Hadamard.

U.S. Pat. No. 3,940,601 entitled "Apparatus For Locating Faults In A Working Storage" granted Feb. 24, 1976 to M. Henry et al.

U.S. Pat. No. 3,944,800 entitled "Memory Diagnostic Arrangement" granted Mar. 16, 1976 to F. V. Beck et al.

U.S. Pat. No. 3,961,251 entitled "Testing Embedded Arrays" granted June 1, 1976 to W. J. Hurley et al.

U.S. Pat. No. 3,961,252 entitled "Testing Embedded Arrays" granted June 1, 1976 to E. B. Eichelberger.

U.S. Pat. No. 3,961,254 entitled "Testing Embedded Arrays" granted June 1, 1976 to J. R. Cavaliere et al.

U.S. Pat. No. 4,001,818 entitled "Digital Circuit Failure Detector" granted Jan. 4, 1977 to F. Radichel et al.

U.S. Pat. No. 4,038,648 entitled "Self-Configurable Circuit Structure For Achieving Wafer Scale Integration" granted July 26, 1977 to G. D. Chesley.

U.S. Pat. No. 4,049,956 entitled "Method of and Means For In-Line Testing Of A Memory Operation In Time-Division Mode" granted Sept. 20, 1977 to W. M. Dirk Van Veen.

U.S. Pat. No. 4,055,754 entitled "Memory Device And Method Of Testing The Same" granted Oct. 25, 1977 to G. D. Chesley.

U.S. Pat. No. 4,066,880 entitled "System For Pretesting Electronic Memory Locations And Automatically Identifying Faulty Memory Sections" granted Jan. 3, 1978 to E. J. Salley.

U.S. Pat. No. 4,171,765 entitled "Error Detection System" granted Oct. 23, 1979 to L. A. Lemone.

U.S. Pat. No. 4,195,770 entitled "Test Generator For Random Access Memories" granted Apr. 1, 1980 to M. K. Benton et al.

U.S. Pat. No. 4,227,244 entitled "Closed Loop Address" granted Oct. 7, 1980 to L. T. Thorsrud et al.

U.S. Pat. No. 4,263,669 entitled "Pattern Generation System" granted Apr. 21, 1981 to D. E. Staiger.

U.S. Pat. No. 4,277,699 entitled "Latch Circuit Operable As A D-Type Edge Trigger" granted July 7, 1981 to D. J. Brown et al.

U.S. Pat. No. 4,290,137 entitled "Apparatus and Method of Testing CML Circuits" granted Sept. 15, 1981 to D. C. Hilker.

U.S. Pat. No. 4,293,950 entitled "Test Pattern Generating Apparatus" granted Oct. 6, 1981 to M. Shimizu et al.

U.S. Pat. No. 4,298,980 entitled "LSI Circuitry Conforming To Level Sensitive Scan Design (LSSD) Rules And Method of Testing Same" granted Nov. 3, 1981 to J. Hajdu et al.

U.S. Pat. No. 4,298,980 entitled "LSI Circuitry Conforming To Level Sensitive Scan Design (LSSD) Rules And Method Of Testing Same" granted Nov. 3, 1981 to J. Hajud et al. U.S. Pat. No. 4,332,028 entitled "Method of Measuring The Memory Address Access Time (AAT) Utilizing A Data Recirculation Technique, and A Tester For Accomplishing Same" granted May 25, 1982 to J. H. Joccotton et al.

Publications

"A Users Handbook Of Semiconductor Memories" by E. R. Hnatek, 1977 John Wiley & Sons, Inc., page 447.

"Electronic Chip-In-Place Test" by P. Goel and M. T. McMahon, ACM IEE Nineteenth Design Automation Conference Proceedings, June 14–16, 1982, IEEE Catalog No. 82CH1759-0, ACM Order No. 477820.

"Logic Card Test Apparatus" by P. B. Shattuck, IBM TDB, Vol. 13, No. 3, August 1970, page 605.

"Integrated Circuit Testing" by P. V. Jordan, IBM TDB, Vol. 13, No. 5, October, 1970.

"Pattern Generating System" by E. Legnard et al, IBM TDB, Vol. 14, No. 2, July, 1971.

"Arrangement For Minimized Functional Test of LSI Logic Chips" by F. Tsui, IBM TDB, Vol. 15, No. 9, February, 1973.

"Single Clock Shift Register Latch" by T. W. Williams, IBM TDB, Vol. 16, No. 6, November, 1973.

"Comparative Circuit Tester" by E. B. Carey et al, IBM TDB, Vol. 16, No. 10, March, 1974.

"Troubleshooting Large-Scale Integrated Circuit Units" by L. D. Howe, et al, IBM TDB, Vol. 17, No. 7, December, 1974.

"Testing LSI Memory Arrays Using On-Chip I/O Shift Register Latches" by P. S. Balasubramanian et al, IBM TDB, Vol. 17, No. 7, December, 1974.

"Combined Test Scanning And Serial-Deserializing Shift Register" by B. M. Ross et al, IBM TDB, Vol. 19, No. 2, July, 1976.

"Memory Testing" by J. Bappert et al, IBM TDB, Vol. 19, No. 5, October, 1976.

"Pattern Generator For A Multipart Number Test System" by J. N. Arnold et al, IBM TDB, Vol. 19, No. 9, February, 1977.

"Delay Testing And Diagnosis Of LSSD Shift Register Strings" by K. E. Dimitri, IBM TDB, Vol. 20, No. 1, June, 1977.

"Selective Control Of Off-Subassembly Drivers To Test Logic Systems" by F. Hsu, et al IBM TDB, Vol. 20, No. 11B, April, 1978.

SUMMARY OF THE INVENTION

A primary object of the invention is to provide an improved memory array chip.

An additional object of the invention is to provide an improved integrated circuit device of high circuit density that is readily testable.

Another object of the invention is to provide an integrated circuit memory array which is readily testable.

Still another object of the invention is to provide an improved integrated circuit device which allows testing of memory arrays and the like embedded within said device.

A further object of the invention is to provide a device that allows array performance testing with simple test equipment and without resorting to sophisticated memory test equipment.

A still further object of the invention is to provide fabrication of LSI semiconductor devices in such manner as to facilitate testing.

Another object of the invention is to provide an improved integrated circuit memory array which can be properly exercised in system use with lesser tolerance requirements on system timing signals than those required by a conventional array chip.

These and other objects are accomplished in accordance with the present invention. One illustrative embodiment of the invention comprises adding latching means to the logical input and output lines to the memory array, including address input, data input, and data output, adding a control network that generates the necessary discrete timing signals on the LSI device, interconnecting this control network with the latching means, providing for external trigger and logic control signals to the control network, and providing for measurement of an output signal from the control network.

The complexity of the timing relationships of the various address, data, and control signals entering and leaving a conventional array chip make it difficult and expensive to test, to guarantee that the chip has been manufactured without defects. The primary objective of the invention is to simplify the external timing requirements, and thus to simplify the test and operational requirements for the array.

To isolate the array chip from external timings, the first step is to place latches in series with the address and data inputs and the data outputs. The overhead from inclusion of these latches may be minimized by incorporating them into the circuitry of the off-chip receivers and drivers, or of the array driver circuits or sense amplifiers. Clock signals to control these latches, as well as the actual array write clock, are developed on-chip. These control signals are triggered by the leading edge of an external clock, with all relative timings, including pulse width, controlled internally. For example, for a write cycle, the clock signal to the address latches is turned on first, then after just enough time for the operation of the address decode, the array write clock is turned on. Timed relationships between external signals are not required, and only a single edge (rather than the width) of the external triggering clock is important. Clocks for the data input latches, and for the data output latches in read mode, are developed with similar appropriate timings.

These clocks are all developed by combining suitably delayed transitions triggered from the external clock. The NOR of one falling signal and one later rising signal supplies a positive clock pulse whose offset and duration is determined by the delays of the two signals. Appropriate delays, as needed for the latch and array circuitry, can be developed from a series of inverters, or by other methods.

The operation of the array is critically dependent on this delay network. Its timing can be tested in manufacturing, even with relatively inexpensive and unsophisticated test equipment, by adding a feedback control circuit to turn it into a recirculating loop. Loop frequency measurement is extremely accurate compared even with expensive delay measurement equipment. If the natural loop frequency would be too high for the test environment, a frequency divider should be added before the output driver instead of adding stages to the loop, to minimize measurement error of the significant circuitry.

Since the chip functions by racing one path (through the array itself) against another (through the delay network), delay defects in the slower path will cause the operation to fail due to a resulting gross DC functional error. Delay defects in the delay network or overall process shift will be detected by RLF measurement. While there is a possibility of some small defects in the delay network escaping this test, the probability is relatively small.

The path delay of the delay network must be designed to be a little longer than that through the array to compensate for the tracking error. To avoid cutting into the yield, the fastest delay network must be slower than the slowest array, as the timings vary due to manufacturing tolerances. Since both paths are on the same chip, contain many stages, and include both directions of transition, this tracking error should be minimal. It is currently estimated that this error will be smaller than the tester accuracy errors for manufacturing test equipment for the foreseeable future.

The timing generation circuitry does not affect application of test patterns to the array; all of the necessary traditional sequences can be used. While it may still be necessary for the tester to apply these patterns at a high repetition rate to detect disturb defects, the tester need not provide precise relative timings. This can reduce tester cost by about a third. Additionally, some of the assembly level testers with very high pin counts, currently unable to do any delay test, can do at least some performance testing.

In system use, presence of the latches in the address and data input paths can provide a significant reduction in cycle time for paths through the array. Since the logic values on the chip inputs are strobed at the beginning of the array operating cycle, and then held internally during completion of the cycle, address and data changes for the next cycle may be initiated during completion of the first cycle. As an example, it is common to have a tolerance for skew between the clock and the data at the input to a latch. If there is a 4 ns skew, an overlap of 3 ns for the next cycle's data with the current cycle's operation is not unreasonable. For an array operating in a 10 ns path, this reduction to 7 ns represents a 30% cycle time reduction. Overlap on a read cycle requires that the system data flow makes use of the address latches.

This strategy may also be extended to logic chips. In this case, it seems most applicable to custom chip designs, where the logic function is simply defined and regulated. If not, it will be somewhat difficult to generate an effective set of test patterns. The design strategy has been shown to offer advantages in chip testing (test accuracy and cost), assembly testing (accuracy and cost, ability to perform a delay test without a high speed buffer, and failure analysis), and system operation (faster cycle time, simpler clock generation, and statistical delay design).

BRIEF DESCRIPTION OF THE DRAWINGS

The foregoing and other object, features, and advantages of the invention will be apparent from the following, more particular description of a preferred embodiment of the invention, as illustrated in the accompanying drawings, wherein:

FIGS. 7A, 7B and 7C respectively disclose a number of idealized waveforms referred to in the explanation of the operation of the invention (FIG. 1) employing the control network of FIG. 6. FIGS. 7A, 7B and 7C respectively disclose in detail the relative timing and waveforms for a "write operation", a "read operation", and a "test operation".

DESCRIPTION OF THE PREFERRED EMBODIMENT

Figure 1:
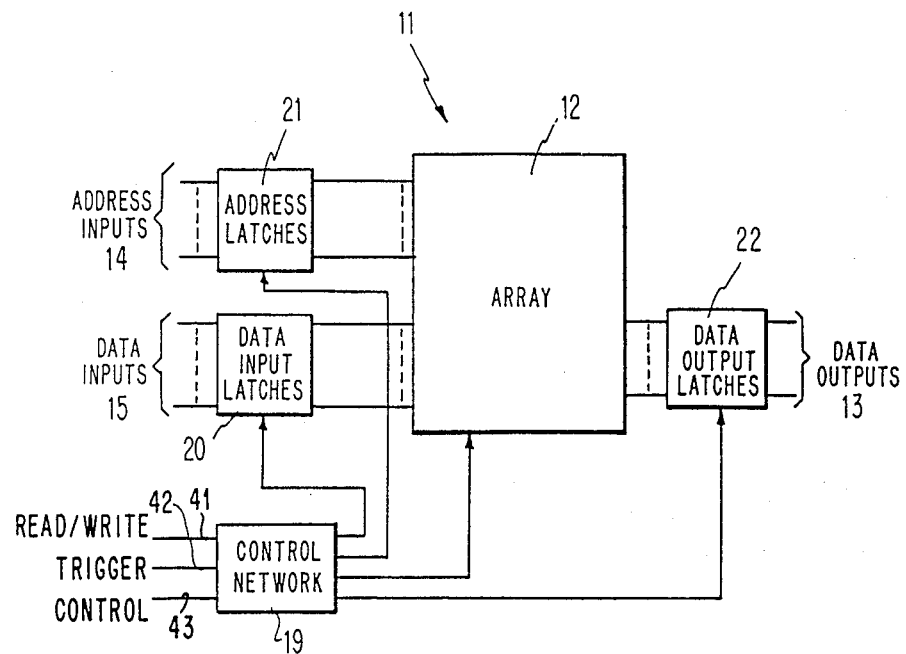
FIG. 1 is a block diagram of an LSI memory array chip or semiconductor device in accordance with the invention.

Referring now to FIG. 1 there is illustrated in block diagram form an LSI chip or semiconductor device 11 in accordance with the teachings of the present invention.

Chip 11 typically includes a memory array 12, a control network 19, data input latches 20, address latches 21, and data output latches 22. The memory array 12 may typically be 64×8, meaning 64 addresses each 8 bits. The invention is not size limited, however, and is applicable to either smaller or larger arrays as well. The memory array 12 is assumed to be a complete basic array, incorporating the normal address decoders, word and bit drivers, and sense amplifiers in addition to the memory cells.

The data input latches 20, address latches 21, and data output latches 22 may be constructed in any of the forms as found commonly in textbooks on logic design, and further may incorporate the Level Sensitive Scan Design (LSSD) technique of Eichelberger (U.S. Patent No. 3,761,695, issued Dec. 25, 1973, and assigned to the same assignee as the present invention) if desired. The data inputs 15, address inputs 14, and data outputs 13 may be connected directly to primary inputs and outputs to the chip, or more generally may connect to logic or other memory arrays on the chip as required for the system function. The inputs 41, 42 and 43 to the control network 19 must be connected directly to chip primary inputs.

If it were not for the functional blocks on the chip (control network 19, and latches 20, 21, and 22) a manufacturing test would require generation of a number of signals with a complex timing interrelationship. With these functional blocks, however, very simple operation is possible where only switching order, and not actual times, must be controlled. This permits use of a much simpler tester, saving significant costs in the manufacturing process.

The key to this apparatus is the control network 19, which performs the following functions:

The control network provides all the timing signals to the array during testing operations. It may also be used to provide all timing signals to the array during system operation as well.

The control network also signals the mode of operation (read or write) to the array.

The control network initiates the proper timing sequence to the array when instructed by an external trigger signal 42.

A performance test may be executed in the write mode by the following sequence of events:

Select the write mode for the array by placing the appropriate signals on the READ/WRITE 41 and control 43 primary inputs.

Place the desired address location on the address input signal lines 14.

Place the desired data bits on the data inputs 15.

Supply a trigger signal on the trigger primary input 42. The write timing sequence will automatically be generated by the control network 19, causing the selected data to be written into the selected address.

The stored data may be read out from the array to verify that the data was written within the generated time period.

A performance test may be executed in the read mode by the following sequence of events:

Store the appropriate data into the appropriate words in the array.

Select the read mode for the array by placing the appropriate signals on the READ/WRITE 41 and control 43 primary inputs.

Load an address different from that desired into the address latches 21.

Place the desired address location on the address input signal lines 14.

Supply a trigger signal on the trigger primary input 42. The read timing sequence will automatically be generated by the control network 19, causing an address change at the input to the array 12. After the proper period the output latches 22 are gated off preventing the data from being stored if the array is not read within the guaranteed time period.

What has been described is that in either the read mode or in the write mode all timings for the array 12 and the latches 20, 21, and 22 surrounding it are generated by the control network. Any desired arbitrary times, matching the specification for the array, can be generated as described later. All times are referenced to an arbitrary trigger signal which starts a fixed sequence of operation. External signals, such as from a tester in the manufacturing area, may be applied without concern for their timing accuracy.

Figure 2:
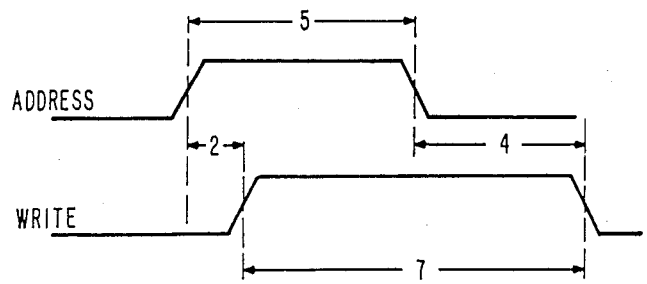
FIG. 2 shows idealized waveforms referred to hereinafter in the explanation of the operation df the memory array chip in accordance with the invention.
Figure 3:
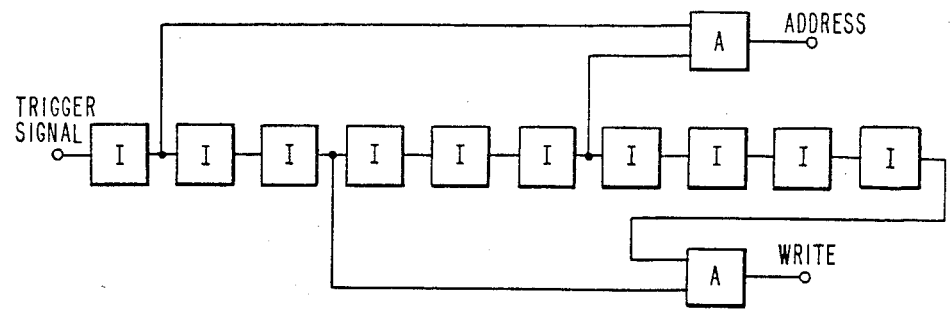
FIGS. 3, 4 and 5 are respectively block diagrams referred to hereinafter in the explanation of the control network of the memory array chip in accordance with the invention.
Figure 4:
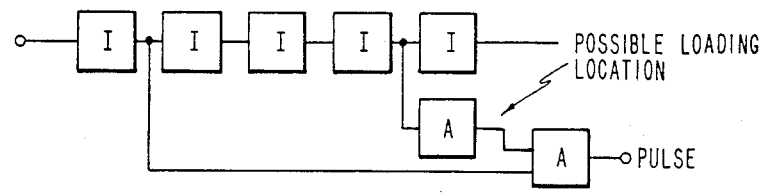

It must further be shown how the timings are generated by the control network 19. In one embodiment, as shown in FIG. 3, all timing signals are generated from an inverter chain. This includes those to inhibit and to release data or addresses from the input and output latches. In this very simplified example only two timing pulses are developed; the generated waveforms are shown in FIG. 2. The I (inverter) and A (AND) gate delays control the pulse widths and timings. The gates shown in FIG. 3 provide pulse widths equal to the delay through an odd number of stages. As shown in FIG. 4, delays for an even number of stages may easily be developed. In addition, loading such as added capacitance and resistance can be used to fine tune the delays and thus the pulse widths and timings.

Since the inverter chain is used to provide all array timing, it can be considered to be an extension of the tester. This circuitry must therefore be tested to insure that it is functioning at its rated speed before using it to test the array. Finally, this test must be within the capabilities of an inexpensive tester or the previously mentioned advantages of the present invention will be wasted.

Figure 5:
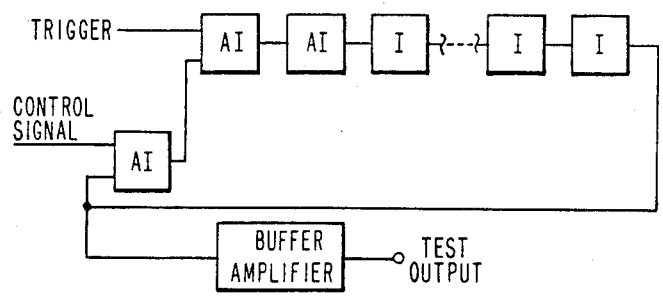

FIG. 5 shows a simple addition to the inverter chain. It provides for a special test mode where the inverter chain is converted into a recirculating loop. DC logic testers that are not suitable for high precision timing tests can frequently make frequency measurements with high degrees of accuracy. By measuring the natural frequency of oscillation of the recirculating loop the actual performance of the control network may be determined. If the natural frequency of the loop is designed above the tester limit, a frequency divider may be included in the buffer amplifier of FIG. 5 without loss of accuracy.(Reference is made to U.S. Pat. No. 4,332,028 fully identified herein above.)

Since the control network is on the same LSI chip as the array, a "fast" chain will coincide with a "fast" array. Little yield loss should occur from process variations.

A "fast" chip containing a delay defect in the array might be within the product specification but fail when tested by its associated "fast" control network. There may be some debate about whether this should be considered a yield loss; it probably reduces long term problems.

The implementation of this circuitry does not preclude use of the latches in system mode, nor does it preclude flush through operation in system mode. However, operation in the flush through mode would reduce the probability that an array that functioned properly in the manufacturing tester would also function properly in the system, as in some cases a delay defect in the control network could mask a defect in the array, while still allowing it to pass the test. This circuitry can coexist with other circuitry that makes use of input and output latches to speed up or simplify testing.

Although the present invention can eliminate the need for a manufacturing tester with close timing tolerances certain types of defects or manufacturing throughput may dictate use of a tester with an extremely high test rate. Nothing in this invention precludes use of this type of tester; in fact, the design of such a tester would be greatly simplified by allowing wider timing tolerances at the chip inputs.

FIGS. 6, 7A, 7B and 7C

Figure 6:
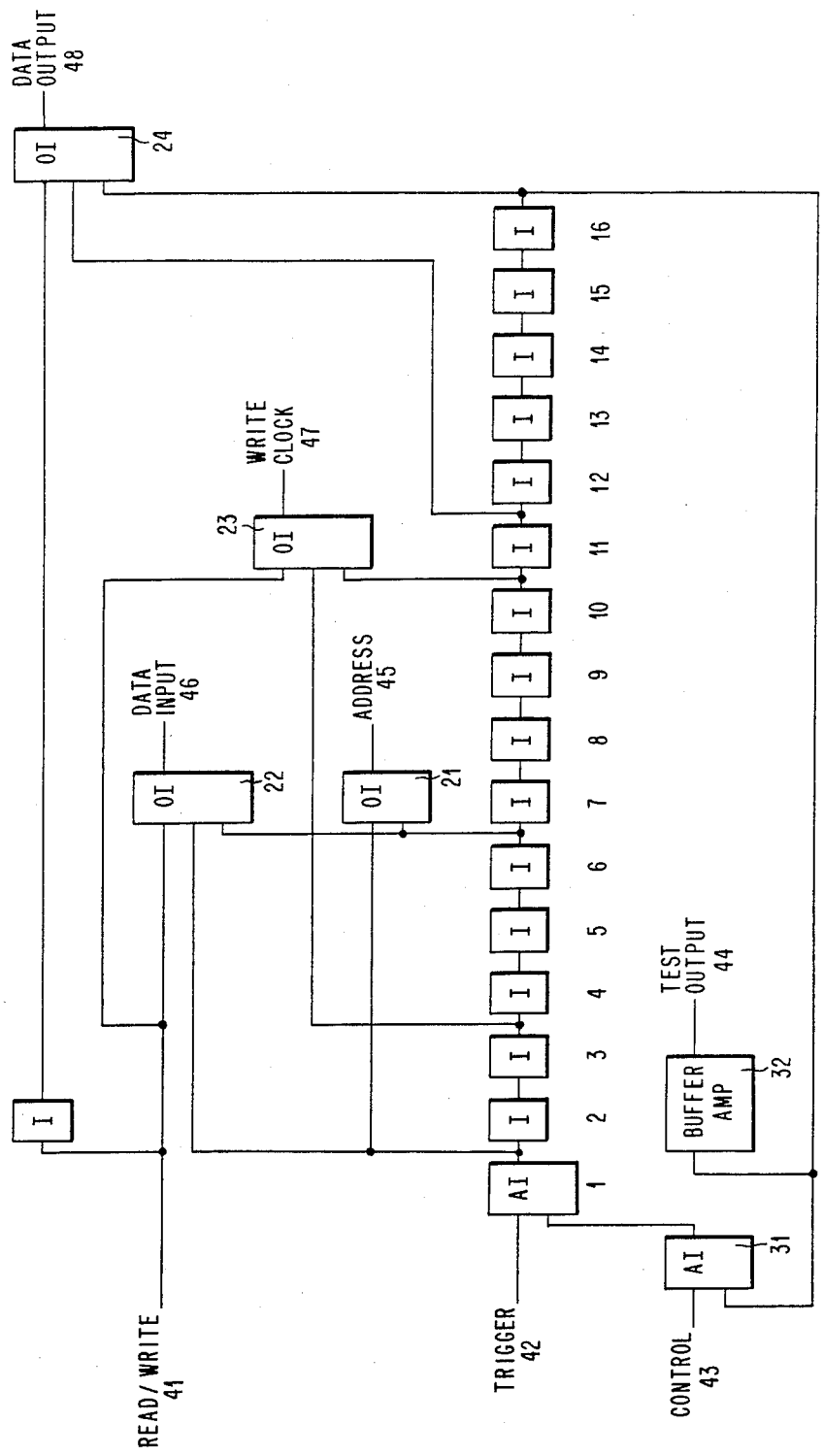
FIG. 6 is a block diagram of the circuit of a control network which may be employed in the memory array chip (FIG. 1) in accordance with the invention.

One possible embodiment of the control network 19 of FIG. 1 is described in detail in FIG. 6. The three modes of operation of this control network 19 are further described, showing the generation of the output waveforms of FIGS. A, 7B and 7C. Nonspecific time units, equal to individual circuit element block delays, are used in these descriptions as the exact timings may vary as needed for the exact performance of the integrated circuit memory array being implemented.

Figure 7A:
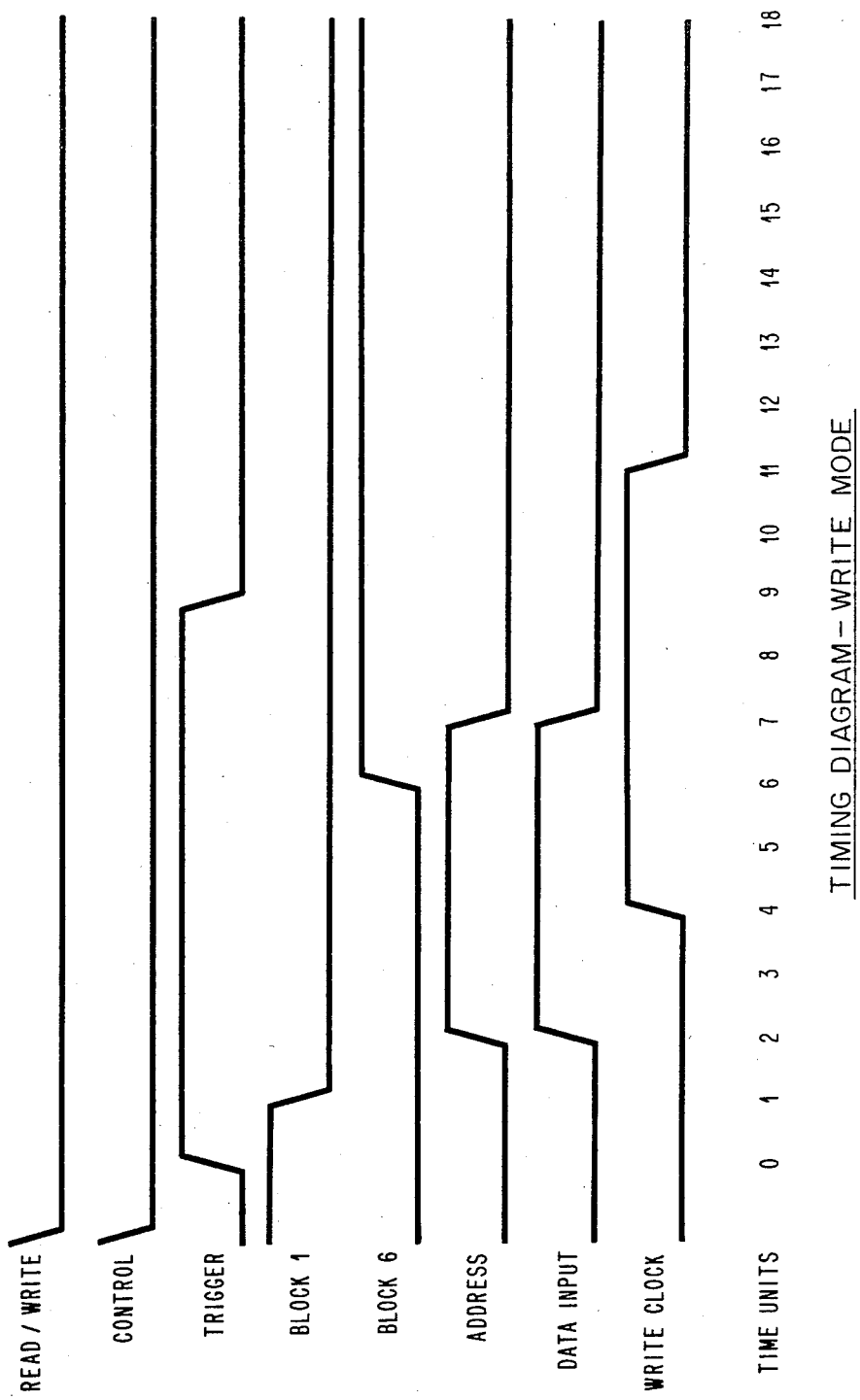

Write Mode (FIGS. 6 and 7A)

Referring now to FIG. 6 and FIG. 7A, the operation of the control network 19 of FIG. 1 will be explained. First, the READ/WRITE input 41 must be preset to a logic value of 0, and the control input 43 must be preset to logic 0. A positive transistion (from 0 to 1) on the trigger input 42 initiates the operation. This causes a negative transistion on the output of block 1 at time 1, and a positive transition on the output of block 6 at time 6. The outputs of blocks 1 and 6 are combined by blocks 21 and 22 to generate pulses 5 time units wide starting at time 2 on both the address 45 and data input 46 outputs from the control network. In FIG. 1, these signals are shown to energize the address 21 and data input 20 latch clocks.

Returning now to FIGS. 6 and 7A we see that similar transistions at the output of blocks 3 and 10, combined by block 23, are used to generate a pulse 7 time units wide starting at time 4 on the write clock output 47. This signal is used to energize the write clock of the array 12 of FIG. 1.

These are all of the control signals needed to complete the write sequence. Any time after time 7 the trigger input 42 may be returned to the logic 0 state to prepare for the next operation, either another write cycle or a read cycle.

Read Mode (FIGS. 6 and 7B)

The operation of the control network in read mode is similar to that described above for the write mode. In this case, the READ/WRITE input 41 must be preset to a logic value of 1, as well as presetting the control input 43 to logic 0. Now when the positive transition on the trigger input 42 initiates the operation, no output pulse occurs on the data input 46 and write clock 47 outputs from the control network. However, the outputs of blocks 11 and 16 now are combined by block 24 to provide a pulse 5 time units wide starting at time 12 on the data output 48 from the control network. This is used to energize the data output 22 latch clocks of FIG. 1.

As with the above write sequence, these are all of the control signals needed to complete the read sequence. Any time after time 5 the trigger input 42 may be returned to the logic 0 state to prepare for the next operation, either another read cycle or a write cycle.

Test Mode (FIGS. 6 and 7C)

The test mode is much simpler than either of the above two operational modes. Preset values of 1. on the READ/WRITE input 41, 1 on the trigger input 42, and 1 on the control input 43 are applied by the tester. An oscillating loop is formed by the blocks 1 through 16 and 31. This signal is picked off by the buffer amplifier 32 and placed on the test output 44 for measurement by the tester. A simple counter controlled by an accurate time source can be used to determined the frequency of oscillation, and delay defects in the oscillating loop will be easily detected.

In addition to the advantages previously mentioned the following additional advantages are listed:

- In between the time two addresses are selected in a system the addresses may be randomly changing. This may subject the array of current designs to stress, and subsequent loss of data (disturb problems). Since with the method of the present invention the address changes only affect the array when the trigger signal arrives the array will be isolated from this situation.
- The complex timing relationships previously required from the system design have been simplified by the circuitry incorporated on the array chip.
- Embedded array testing is greatly simplified.

It should be noted that while specific means have been shown in relation to the design of the control network 19, other means could be used. While the particular design for the control network 19 has been described for a single port array, it will be understood and appreciated by those skilled in the art that a design appropriate for a multiport array may be readily provided by following the teachings of the invention. Also, referring to FIG. 1 and the description thereof, it is to be appreciated that the "address latches", "data input latches" and "data output latches" may be incorporated into the array circuitry. While the invention has been particularly shown and described with reference to the preferred embodiment hereof, it will be understood by those skilled in the art that various changes in form and detail may be made without departing from the spirit and scope of the invention.

What is claimed is:

1. A process for testing a read/write memory array embedded within an integrated circuit device, said integrated circuit device including, a READ/WRITE memory array, address latch circuit means having an output connected to said READ/WRITE memory array, data input latch circuit means having an output connected to said READ/WRITE memory array, data output latch circuit means having an input connected to said READ/WRITE memory array, timing control network circuit means, said timing control network circuit means having a trigger signal chip input, a READ/WRITE control chip input and first, second, third and fourth outputs, said first, second, third and fourth outputs of said timing control network circuit means being respectively connected to said address latch circuit means, said data input latch circuit means, said READ/WRITE memory array and said output latch circuit means, said process comprising the following steps:

(a) select the WRITE mode for the array by conditioning the READ/WRITE control chip input of the timing control network;

(b) place the desired memory address on address input lines of the address latch circuit means;

(c) place the desired data bits on data input lines of the data input latch circuit means; and, (d) provide a trigger signal from off chip to the trigger signal chip input of the timing control network whereby the WRITE timing sequence for the memory array will be automatically generated by the timing control network and the desired data will be written into the memory array at the desired address.

2. A process for testing a read/write memory array embedded within an integrated circuit device, as recited in claim 1, wherein subsequent to step (d) of claim 1 the following steps are performed:

(e) select the READ mode for the array by conditioning the READ/WRITE control chip input of the timing control network;

(f) place said desired address on the address input lines of the address latch circuit means; and, (g) provide a trigger signal from off chip to the trigger signal chip input of the timing control network, whereby the READ timing sequence for the memory array will be automatically generated by the timing control network and the output latches will capture within a predetermined time the data stored in said READ/WRITE memory array at said desired address.

3. In an integrated circuit chip, a memory array, said memory array including:

a plurality of memory elements for storing binary data, said stored binary data being arranged within said array at a plurality of addressable locations;

controllable write circuits means for writing data into said memory array at a predetermined address within said array;

controllable read circuit means for reading data stored in said memory array at a predetermined address within said array;

gated address latch circuit means coupled to said controllable write circuit means and said controllable read circuit means, said gated address circuit means providing said predetermined address to said write circuit means or said read circuit means;

gated data input latch circuit means coupled to said controllable write circuit means, said gated input latch circuit means providing data to be written into said memory array at said predetermined address provided by said address latch circuit means;

gated data output latch circuit means coupled to said controllable read circuit means, said gated output latch circuit means receiving the binary data read from the memory array as indicated by the predetermined address by said controllable read circuit means; and said integrated circuit chip being further characterized by the inclusion of timing control network circuit means, said timing control network circuit means coupled to and controlling said controllable write circuit means and said controllable read circuit means, said timing control network circuit means also being coupled to said gated address latch circuit means, said gated data input circuit means and said gated data output circuit means, said timing control network on said integrated circuit chip including a trigger signal responsive tapped delay line and said timing control network providing all timing control signals for the operation of said memory array contained on said integrated circuit chip upon receipt of a trigger signal subsequent to the conditioning of an on chip READ/WRITE control input.

4. A process for reading data from a READ/WRITE memory array embedded within an integrated circuit device, said integrated circuit device including a READ/WRITE memory array, address latch circuit means having an output connected to said READ/WRITE memory array, data input latch circuit means having an output connected to said READ/WRITE memory array, data output latch circuit means having an input connected to READ/WRITE memory array, timing control network circuit means, said timing control network circuit means having a trigger signal chip input, a READ/WRITE control chip input and first, second, third and fourth outputs, said first, second third and fourth outputs of said timing control network circuit means being respectively connected to said address latch circuit means, said data input latch circuit means, said READ/WRITE memory array and said output latch circuit means, said process comprising the following steps:

(a) select the READ mode for the array by conditioning the READ/WRITE control chip input of the timing control network;

(b) place the desired memory address on address input lines of the address latch circuit means; and, (c) provide a trigger signal from off chip to the trigger signal chip input of the timing control network, whereby a READ timing sequence for the memory array will be automatically generated by the timing control network and the output latches will capture within a predetermined time the data stored in said READ/WRITE memory array at said desired address.

5. In a READ/WRITE memory array embedded within an integrated circuit device contained on a semiconductor chip, said integrated circuit device including memory array circuit means, said memory array circuit means including, a READ/WRITE memory array, address latch circuit means having on chip inputs for receiving an address and output means connected to said memory array, data input latch circuit means having on chip inputs for receiving input data and output means connected to said memory array, data output latch circuit means having on chip inputs connected to said READ/WRITE memory array and output means for providing a data output, and a timing control network, said timing control network having a trigger signal chip input terminal, a READ/WRITE control chip input terminal and first, second, third and fourth outputs, said first, second, third and fourth outputs of said timing control network being respectively connected to said address latch circuit means, said input latch circuit means, said READ/WRITE memory array and said output latch circuit means, said timing control network upon conditioning of said READ/WRITE control and in response to a trigger signal automatically providing a "WRITE" timing sequence for a "WRITE" mode of operation of said READ/WRITE memory array or a "READ" timing sequence for a "READ" mode of operation of said read/write memory array, said timing control network comprising:

a control input terminal adapted to receive a control signal from off chip;

said trigger signal chip terminal adapted to receive a trigger signal from off chip;

said read/write control chip input terminal adapted to receive a read/write signal from off chip;

an on-chip output control terminal connected to said output latch circuit means;

an on-chip data input control terminal connected to said data input latch circuit means;

an on-chip address control terminal connected to said address latch circuit means;

an on-chip write clock control terminal connected to said read/write memory array;

n serially connected INVERTER circuits, where n is an integer, said n serially connected INVERTER circuits forming a delay circuit having an input, an output and at least first, second, third and fourth (time displaced) spaced apart taps;

a single INVERTER circuit having an input connected to said read/write input terminal of said timing control network and an output;

a first AND-INVERTER circuit having a first input connected to said trigger input terminal of said timing control network, a second input, and an output connected to said input of said delay circuit formed by said n serially connected INVERTER circuits;

a second AND-INVERTER circuit having a first input connected to said control input terminal of said timing control network, a second input connected to said output of said delay circuit formed by said n serially connected INVERTER circuits and an output connected to said second input of said first AND-INVERTER circuit;

a first OR-INVERTER circuit having a first input connected to said read/write input terminal of said timing control network, a second input connected to said output of said first AND-INVERTER circuit, a third input connected to said second tap on said delay circuit formed by said n serially connected INVERTER circuits, and an output connected to said on-chip data input control terminal of said timing control network;

a second OR-INVERTER circuit having a first input connected to said output of said first AND-INVERTER circuit, a second input connected to second tap on said delay circuit formed by said n serially connected INVERTER circuits, and an output connected to said on-chip address control terminal of said timing control network;

a third OR-INVERTER circuit having a first input connected to said read/write input terminal of said timing control network, a second input connected to said first tap on said delay circuit formed by said n serially connected INVERTER circuits, a third input connected to said third tap on said delay circuit formed by said n serially connected delay circuits and an output connected to said on-chip write clock control terminal of said timing control network; and, a fourth OR-INVERTER circuit having a first input connected to said output of said single INVERTER circuit, a second input connected to said fourth tap of said delay circuit formed by said n serially connected INVERTER circuits, a third input connected to said output of said delay circuit formed by said n serially connected INVERTER circuits, and an output connected to said on-chip data output control terminal of said timing control network.

6. In a READ/WRITE memory array embedded within an integrated circuit device contained on a semiconductor chip, said integrated circuit device including memory array circuit means, said memory array circuit means including, a READ/WRITE memory array, address latch circuit means having on chip inputs for receiving an address and output means connected to said memory array, data input latch circuit means having on chip inputs for receiving input data and output means connected to said memory array, data output latch circuit means having on chip inputs connected to said READ/WRITE memory array and output means for providing a data output, and a timing control network, said timing control network having a trigger signal chip input terminal, a READ/WRITE control chip input terminal and first, second, third and fourth outputs, said first, second, third and fourth outputs of said timing control network being respectively connected to said address latch circuit means, said input latch circuit means, said READ/WRITE memory array and said output latch circuit means, said timing control network upon conditioning of said READ/WRITE control and in response to a trigger signal automatically providing a "WRITE" timing sequence for a "WRITE" mode of operation of said READ/WRITE memory array or a "READ" timing sequence for a "READ" mode of operation of said read/write memory array, said timing control network comprising:

a control input terminal adapted to receive a control signal from off chip;

said trigger signal chip terminal adapted to receive a trigger signal from off chip;

said read/write control chip input terminal adapted to receive a read/write signal from off chip;

an on-chip output control terminal connected to said output latch circuit means;

an on-chip data input control terminal connected to said data input latch circuit means;

an on-chip address control terminal connected to said address latch circuit means;

an on-chip write clock control terminal connected to said read/write memory array;

n serially connected INVERTER circuits, where n is an integer, said n serially connected INVERTER circuits forming a delay circuit having an input, an output and at least first, second, third and fourth (time displaced) spaced apart taps;

a single INVERTER circuit having an input connected to said read/write input terminal of said timing control network and an output;

a first AND-INVERTER circuit having a first input connected to said trigger input terminal of said timing control network, a second input, and an output connected to said input of said delay circuit formed by said n serially connected INVERTER circuits;

a second AND-INVERTER circuit having a first input connected to said control input terminal of said timing control network, a second input connected to said output of said delay circuit formed by said n serially connected INVERTER circuits and an output connected to said second input of said first AND-INVERTER circuit;

a first OR-INVERTER circuit having a first input connected to said read/write input terminal of said timing control network, a second input connected to said output of said first AND-INVERTER circuit, a third input connected to said second tap on said delay circuit formed by said n serially connected INVERTER circuits, and an output connected to said on-chip data input control terminal of said timing control network;

a second OR-INVERTER circuit having a first input connected to said output of said first AND-INVERTER circuit, a second input connected to said second tap on said delay circuit formed by said n serially connected INVERTER circuits, and an output connected to said on-chip address control terminal of said timing control network;

a third OR-INVERTER circuit having a first input connected to said read/write input terminal of said timing control network, a second input connected to said first tap on said delay circuit formed by said n serially connected INVERTER circuits, a third input connected to said third tap on said delay circuit formed by said n serially connected delay circuits and an output connected to said on-chip write clock control terminal of said timing control network;

a fourth OR-INVERTER circuit having a first input connected to said output of said single INVERTER circuit, a second input connected to said fourth tap of said delay circuit formed by said n serially connected INVERTER circuits, a third input connected to said output of said delay circuit formed by said n serially connected INVERTER circuits, and an output connected to said on-chip data output control terminal of said timing control network and, wherein said READ/WRITE memory array is further characterized in that said timing control network further includes:

a test output terminal for providing an off chip test signal; and, buffer amplifier circuit means having an input connected to said output of said delay circuit formed by said n serially connected delay circuits and an output connected to said test output terminal of said timing control.

7. In an integrated circuit chip, a memory array, said memory array including:

a plurality of memory elements for storing binary data, said stored binary data being arranged with said array at a plurality of addressable locations;

controllable write circuits means for writing data into said memory array at a predetermined address within said array;

controllable read circuit means for reading data stored in said memory array at a predetermined address within said array;

gated address latch circuit means coupled to said controllable write circuit means and said controllable read circuit means, said gated address circuit means providing said predetermined address to said write circuit means or said read circuit means;

gated data input latch circuit means coupled to said controllable write circuit means, said gated input latch circuit means providing data to be written into said memory array at said predetermined address provided by said address latch circuit means; and gated data output latch circuit means coupled to said controllable read circuit means, said gated output latch circuit means receiving the binary data read from the memory array as indicated by the predetermined address by said controllable read circuit means;

said integrated circuit chip being further characterized by the inclusion of timing control network circuit means, said timing control network circuit means coupled to and controlling said controllable write circuit means and said controllable read circuit means, said timing control network circuit means also being coupled to said gated address latch circuit means, said gated data input circuit means and said gated data output circuit means, said timing control network on said integrated circuit chip consisting essentially of a serial chain of inverter circuits and said timing control network prividing all timing control signal for the operation of said memory array contained on said integrated circuit chip upon receipt of a trigger signal subsequent to the conditioning of an on chip READ/WRITE control input.

* * * * *